(12) United States Patent
Ray

(10) Patent No.: US 9,190,998 B2
(45) Date of Patent: Nov. 17, 2015

(54) OPTICAL SWITCH

(75) Inventor: Elton Tarik Ray, Livonia, NY (US)

(73) Assignee: XEROX CORPORATION, Norwalk, CT (US)

( * ) Notice: Subject to any disclaimer, the term of this patent is extended or adjusted under 35 U.S.C. 154(b) by 698 days.

(21) Appl. No.: 13/443,423

(22) Filed: Apr. 10, 2012

(65) Prior Publication Data

US 2013/0266256 A1 Oct. 10, 2013

(51) Int. Cl.
*G02B 6/26* (2006.01)
*G02B 6/10* (2006.01)
*H03K 17/96* (2006.01)
*G02B 6/35* (2006.01)
*G02B 6/42* (2006.01)

(52) U.S. Cl.
CPC ........ *H03K 17/9629* (2013.01); *H03K 17/9631* (2013.01); *H03K 17/9638* (2013.01); *G02B 6/3522* (2013.01); *G02B 6/4298* (2013.01)

(58) Field of Classification Search
CPC .......... H03K 17/9627; H03K 17/9629; H03K 17/9631; H03K 17/9638; G02B 6/3522; G02B 6/4298
USPC ................. 385/12, 16–18, 22–23, 31, 32, 39, 385/129–132; 250/221, 227.11–227.14; 356/432; 29/428; 264/1.24; 345/173, 345/175–176; 341/20, 22, 31
See application file for complete search history.

(56) References Cited

U.S. PATENT DOCUMENTS

| 5,605,406 | A | 2/1997 | Bowen |
| 5,822,073 | A | 10/1998 | Yee et al. |
| 6,181,847 | B1 | 1/2001 | Baker et al. |
| 2002/0003206 | A1* | 1/2002 | Culver .......................... 250/221 |
| 2008/0144333 | A1 | 6/2008 | Gourlay |

OTHER PUBLICATIONS

Chin Hin Oon, U.S. Appl. No. 11/484,377, filed Jul. 10, 2006, entitled Optical Generic Switch Panel.

* cited by examiner

*Primary Examiner* — Akm Enayet Ullah
*Assistant Examiner* — Michael Mooney
(74) *Attorney, Agent, or Firm* — Pillsbury Winthrop Shaw Pittman LLP

(57) ABSTRACT

Aspects of the disclosure include an optical button, that can include an input portion that is printed on a substrate, the input portion being configured to change an optical characteristic of light passing therethrough when in contact with an external object, and a detector that is optically coupled with the input portion to detect a change in the optical characteristic of light passing through the input portion.

27 Claims, 7 Drawing Sheets

| SENSOR INTENSITY | | | INPUT PRESSED |
|---|---|---|---|
| A | B | C | |
| LOW | | | 1 |
| HI | LOW | | 2 |
| | HI | | 3 |
| | LOW | HI | 4 |
| | | LOW | 5 |

OPTICAL SWITCH

BACKGROUND

Aspects of the disclosure relate to optical switches and, in particular, to optical switches that can be printed on a substrate. Aspects of the disclosure also relate to uses of optical switches and optical switch printing techniques.

Generally, switches can be useful for initiating a change between states of a device. For example, a power switch can change a device form an "on" to an "off" state. Currently, switches are coupled to numerous devices to permit a user to toggle between the different states of that device.

SUMMARY

Aspects of the disclosure can provide an optical button that can include an input portion that is printed on a substrate, the input portion being configured to change an optical characteristic of light passing therethrough when in contact with an external object. The optical button that can also include a detector that is optically coupled with the input portion to detect a change in the optical characteristic of light passing through the input portion.

Further aspects of the optical button can include a waveguide portion that is arranged on the substrate between the input portion and the detector, and that is configured to guide light from the input portion to the detector. The optical button may have a cladding layer that is formed on a surface of the waveguide portion, the cladding layer being configured to retain light within the waveguide portion and prevent ambient or external light from entering the waveguide portion. Additionally, the optical button can include a first waveguide that is formed between the detector and the input portion and a second waveguide that is formed between the light source and the input portion.

Additional aspects of the disclosure can provide an optical button that can include a light source that is optically coupled with the input portion to provide light to the input portion. The optical button can operate so that during a first mode, light from the light source passes through the input portion with a first optical characteristic, and during a second mode light from the light source passes through the input portion with a second optical characteristic. The detector can detect whether the light passing through the input portion has the first optical characteristic or the second optical characteristic. During the first mode, the input portion can be unobstructed, while during the second mode, the input portion can be in contact with an external object. In a similar manner, during the first mode, the input portion can be unobstructed, while during the second mode, the input portion can be covered by an external object.

Aspects of the disclosure also describe a method of making an optical button, including printing an optical material onto a substrate to form an optical input portion thereon, and optically coupling a detector with the optical input portion so that the detector detects a change in an optical property of the optical input portion. The method can further include arranging a waveguide portion on the substrate between the input portion and the detector that is configured to guide light from the input portion to the detector. Additionally, the method can include forming a cladding layer on a surface of the waveguide portion, the cladding layer being configured to retain light within the waveguide portion and prevent ambient light from entering the waveguide portion.

Additional aspect of the disclosure include a method of making an optical button including the steps of forming a first waveguide between the detector and the input portion, and forming a second waveguide between the light source and the input portion. The optical switch of the disclosure may also include a light source that is optically coupled with the input portion to provide light to the input portion. During operation, during a first mode, light from the light source passes through the input portion with a first optical characteristic, and during a second mode, light from the light source passes through the input portion with a second optical characteristic.

Aspects of the disclosure can also include a method of using an optical button that is printed on a substrate, including monitoring light passing through an input portion, and detecting a change of state of the light passing through the input portion, when an optical characteristic of a light changes from a first optical characteristic.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION/EMBODIMENTS

Figure 1A:
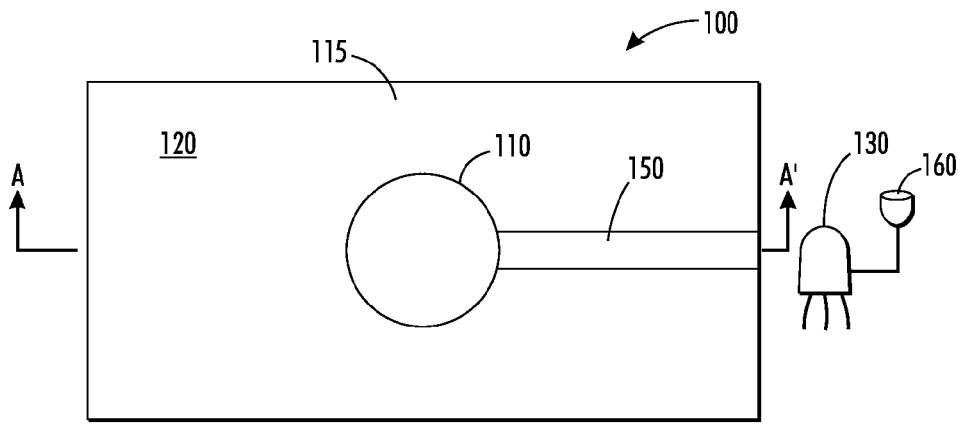
FIGS. 1A-C present an optical switch according to an aspect of the disclosure.

FIGS. 1A-C, 2A-B & 3A-D show exemplary diagrams of an optical switch 100. In FIG. 1A, an optical switch 100 having an input portion 110 is arranged on a substrate 120. A detector 130 is positioned in proximity to the input portion 110. In the embodiment, the optical switch 100 can also include a waveguide portion 150 that is arranged between the input portion 110 and the detector 130. The input portion 110 and/or the waveguide portion 150 can be mounted on the substrate 120 using any technique, including adhesives and/or printing.

The input portion 110 of the optical switch can be made of any material that receives light and permits the light to pass therethrough. Exemplary materials that the input portion 110 can be made of include clear toner, gloss varnish, epoxy resin, silicone gel, clear liquid materials that harden when exposed to UV light, inks that dry clear such as those used to make surfaces glossy in ink jet printing, offset printing, screen printing or in hybrid processes employing permutations of the aforementioned.

The waveguide portion 150 can be formed separately from or integrally with the input portion 110, and can be made of a material that can optically couple the input portion 110 to the detector 130. The waveguide portion 150 can also be at least partially covered by a cladding. The cladding can reduce or prevent the amount of unwanted light entering or exiting the waveguide portion 150. For example, the cladding can be arranged along the entire surface of the waveguide portion 150, except for where light is intended to enter and exit, or only on a top surface of the waveguide portion 150 that is not in contact with the substrate 120.

The detector 130 can be any device that is capable of detecting light passing through the input portion 110. As shown, the detector 130 is optically coupled with the input portion 110 to detect a change in an optical characteristic of light passing through the input portion 110. Depending on the application of the optical switch 100, the waveguide 150 may optionally be positioned between the input portion 110 and the detector 130, and the detector 130 can detect the light passing through both the input portion 110 and the waveguide 150. Also, while shown external to the input portion, it should be understood the detector 130 may be formed in a more integral manner with the input portion 110. For example, the detector 130 can be arranged within the input portion 110 to detect the change in an optical characteristic of light passing through the input portion 110.

Optionally, a periphery portion may be formed around the input portion 110 and/or the waveguide portion 150. The periphery portion 115 can be formed separately from or integrally with the input portion 110 and/or waveguide portion 150, and can be made of a material that can optically contain light traveling within the input portion 110 and/or waveguide portion 150. The periphery portion 115 may be arranged or printed on the substrate and can be made of any material that can reduce or prevent the amount of unwanted light entering or exiting the input portion 110 and/or waveguide portion 150. In an exemplary embodiment, the periphery portion can be printed onto the substrate as the input portion 110 is being printed onto the substrate. Exemplary materials that the periphery portion 115 can be made of include opaque toner, opaque offset-printing ink, or opaque ink-jet ink. Any of these materials may consist of a silvered or metallic colorant to provide reflective properties. One example may be nanosilver ink-jet ink such as has been used to ink-jet print electronic circuits. Alternatively, a portion of the substrate 120 may form the periphery portion 115.

The substrate 120 can be made of any material on which the input portion 110 can be mounted. For example, the input portion can be mounted onto a metal or plastic substrate 120. Other examples of substrates 120 include paper or fabric, such as pages of a book, document, or article of clothing. Further examples of substrates 120 include the surface of devices (such as medical devices), card-stock, vellum, non-refractive glass, fiberglass, wood, stone, plaster, or painted surfaces.

The optical button 100 may also include an ambient detector 160. The ambient detector 160 senses the ambient conditions surrounding the input portion 110, such as the amount of ambient light that the input portion 110 receives under an unobstructed/uncovered condition. The ambient detector 160 can be coupled to the detector 130, or a corresponding controller (not shown) so that the detector 130 may be able to more accurately sense when the input portion 110 is obstructed versus unobstructed. In other words, by knowing the conditions of the surrounding environment, the detector 130 can be able to more accurately detect optical characteristic of light passing through the import portion 110.

Figure 1B:
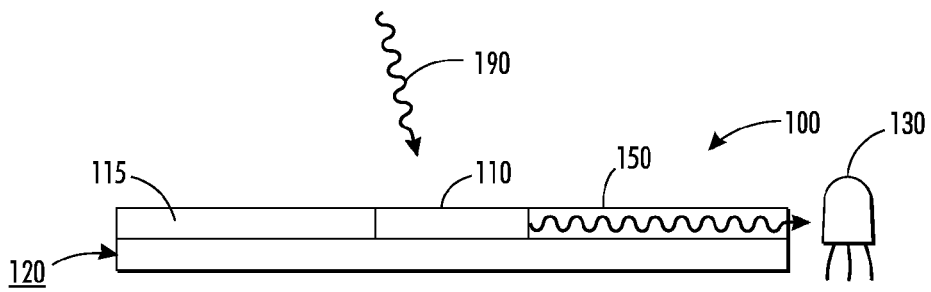

FIG. 1B shows a cross-sectional view of the optical switch 100 taken along line A-A' in FIG. 1A. In operation, ambient light 190 from a surrounding environment can pass through the input portion 110 to the detector 130. All or a portion of the ambient light 190 that passes through the input portion 110 can be directed to the detector 130. As shown in FIG. 1B, the waveguide portion 150 can guide the light passing through the input portion 110 to the detector 130. When the input portion 110 is unobstructed, the light passing through the input portion 110 can have a first optical characteristic, for example a first magnitude. The detector 130 can detect this first optical characteristic of the light.

Figure 1C:
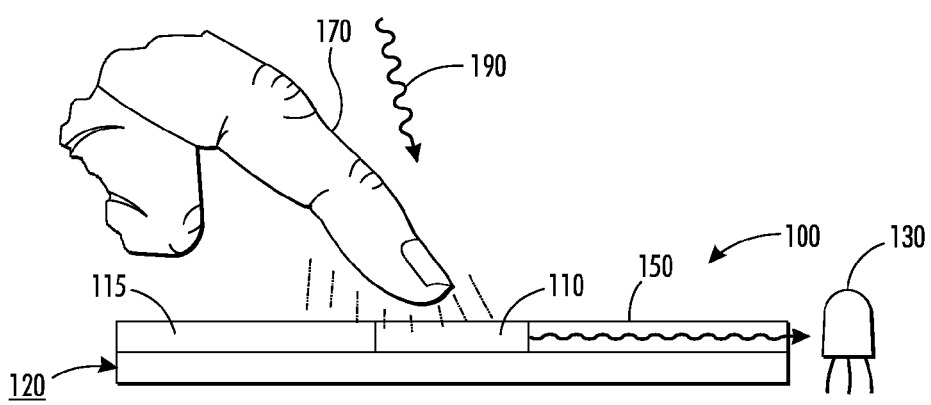

As alternatively shown in FIG. 1C, when the input portion 110 is obstructed by an external object, such as a finger 170, the ambient light 190 passing through the input portion 110 can be fully or partially blocked, and therefore unable to enter the input portion 110. The obstruction of the input portion 110 can impart a second optical characteristic on the light passing through the input portion 110, for example a second magnitude. Accordingly, when the input portion 110 is obstructed, the light directed to the detector 130 undergoes a change in an optical characteristic. The detector 130 can detect this second optical characteristic of the light.

The detector 130 can generate a signal based on the optical characteristic of the light that it detects. For example, when the detector 130 detects light having a first optical characteristic, the detector 130 can produce a first signal. Alternatively, when the detector 130 detects light having a second optical characteristic, the detector 130 can produce a second signal. The signal can be transmitted to a controller (not shown) that may further process the signal to determine whether the optical switch 100 is being selected or not.

Figure 2A:
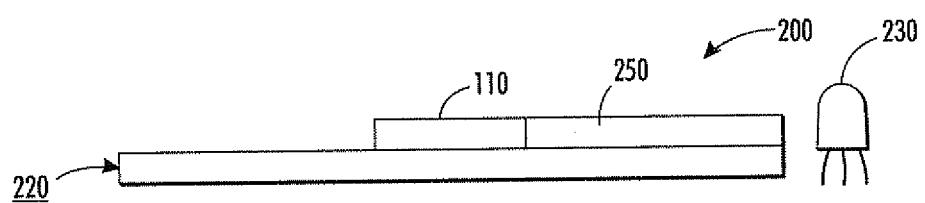
FIGS. 2A-B present an optical switch according to another aspect of the disclosure.

FIGS. 2A and B show another exemplary embodiment of an optical switch 200. The structure of the optical switch 200 is similar to the structure described in FIGS. 1A-C, with the exceptions that the input portion 210, the waveguide 250 and the detector 230 can be configured to transmit and detect particular wavelengths of light, such as the infrared wavelength. When an external object, such as a finger 270, is not in proximity with the input portion 210, the detector 230 senses that the particular wavelength, such as infrared wavelength, is not present in the input portion 210. Thus, the light passing through the input portion 210 can have a first optical characteristic, for example an absence of the particular wavelength. The detector 230 can detect this first optical characteristic of the light.

Figure 2B:
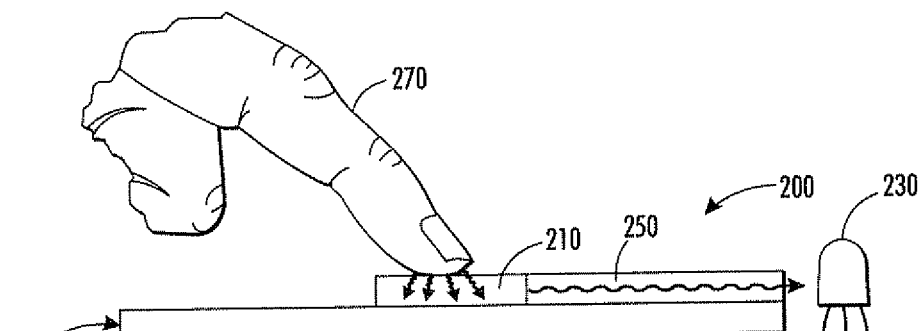

In FIG. 2B, when a finger 270 comes into proximity with the input portion 210, infrared light from the finger 270 can be transmitted into the input portion 210. The infrared light passes through the input portion 210 and is detected by the detector 230. As shown in FIG. 2B, the waveguide 250 may be used to direct the infrared light from the input portion 210 to the detector 230. Thus, the light passing through the input portion 210 can have a second optical characteristic, for example, the presence of the light having an infrared wavelength. The detector 230 can detect this second optical characteristic of the light.

Figure 3A:
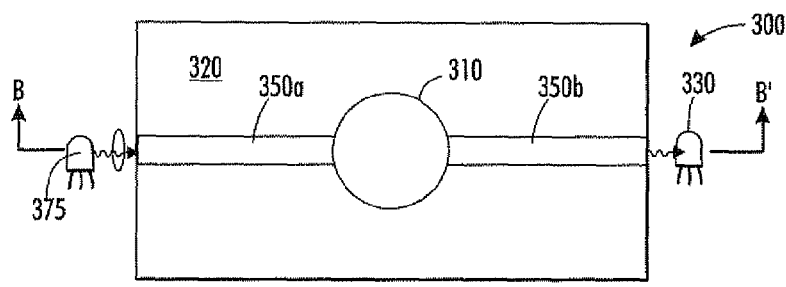
FIGS. 3A-D present an optical switch according to yet another aspect of the disclosure.

FIGS. 3A-D show another exemplary embodiment of an optical switch 300. As shown in FIG. 3A, the optical switch 300 includes an input portion 310 arranged on a substrate 320 in proximity to a detector 330 and a light source 375. Additionally, the optical switch 300 may include waveguide portions 350a and 350b, which optically couple the input portion 310 to the light source 375 and the detector 330, respectively.

The light source 375 can be any device capable of emitting light into the input portion 310. Specifically, the light source 375 can be optically coupled with the input portion 310 and detector 330 such that detector 330 can detect a change in an optical characteristic of the light from light source 370 passing through the input portion 310. For example, while the input portion 310 is in an unobstructed state, light emitted from light source 375 passes through the input portion 310 to the detector 330 so that the emitted light 390 can be detected by the detector 330. Alternatively, when light passing through the input portion 310 is obstructed by, for example, a user's finger 370 covering the input portion 310, the emitted light 390 passing through the input portion 310 to the detector 330 may be absorbed or reflected by the obstruction, such that the detector 330 detects the change in an optical characteristic due to the absorption and/or reflection of emitted light 390.

In one embodiment, the presence of the user's finger 370 over the input portion 310 can change the way that light passes through the input portion 310. For example, contact of the user's finger 370 with the input portion 310 can change the internal reflection property of the input portion, and thus an amount of light that is internally reflected within the input portion. As a result, the amount of light passing through the input portion 310 can change an optical characteristic of the light passing through the input portion 310. The detector 330 can detect the change in the optical characteristic of the light passing through the input portion.

The light source 375 may be any light source that is capable of emitting light. Examples of light sources 375 include light emitting diode (LED), laser, incandescent, florescent, halogen, gas discharge, ambient daylight, whale oil lanterns, phosphorescent moss and the like. The light source can be matched with the optical properties of the material so that certain wavelengths could be permitted/restricted. Light source 375 may include a lens portion 380 that can guide light into the waveguide portion 350a.

Figure 3B:
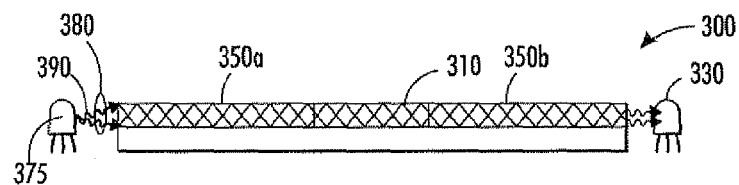

FIG. 3B shows a cross-sectional view of the optical switch 300 taken along line B-B' in FIG. 3A. As can be seen in FIG. 3B, during operation, emitted light 390 propagates through waveguide portion 350a into input portion 310. In an unobstructed state, the emitted light 390 passes through the input portion 310 to the waveguide portion 350b. As is shown in FIG. 3(b), light passing through input portion 310 is guided by waveguide portion 350b to the detector 330. The detector 330 can detect the emitted light 390 passing through input portion 310 while input portion 310 is unobstructed, and use the detection as a baseline reading corresponding to when the input portion is unobstructed.

Figure 3C:
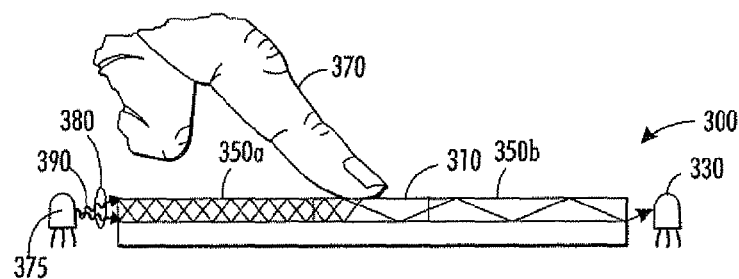

FIG. 3C shows the same cross-sectional view of the optical switch 300 taken along line B-B' in FIG. 3A, except in FIG. 3C, the input portion is in contact with a user's finger 370. As finger 310 obstructs or covers the input portion 310, emitted light 390 is absorbed and/or reflected in a manner different than if finger 310 was not in contact with input portion 310. Accordingly, an optical characteristic of the light passing to the detector undergoes a change in its optical characteristics. In one example, the magnitude of the light transmitted to the detector 330 can be decreased.

As shown in FIG. 3C, the input portion 310 that is in contact with the user's finger 370 imparts a change in the optical characteristic of the emitted light 390 passing through the input portion 310. This change can be manifested by the waveguide portion 350b having a smaller magnitude and a different internal reflection pattern than the light passing through the waveguide portion 350a. Thus, the detector 330 can sense a change in the optical characteristics of the emitted light 390 passing through the input portion 310.

Figure 3D:
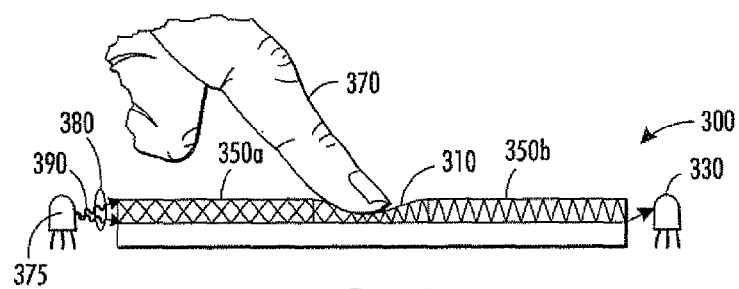

FIG. 3D shows another exemplary embodiment of the optical switch 300. In the embodiment shown in 3D, the input portion 310 may be formed of a material that may deform in response to contact with an external object, such as finger 370. Thus, when finger 370 is not in contact with input portion 310, the detector 370 senses the emitted light 390 from light source 375, and may determine a baseline reading for the light passing through input portion 310. The non-deformed input portion 310 can result in light of a first optical characteristic. Alternatively, as shown in FIG. 3D, when finger 370 comes into contact with the input portion 310, the surface of input portion 310 is deformed. This deformation changes the optical characteristics of input portion 310 and can result in light of a second optical characteristic.

As shown in FIG. 3D, while the input portion 310 is deformed, the deformation can impart a second optical characteristic on the light. For example, a portion of the light passing through input portion 310 can be reflected and/or absorbed by finger 370. Accordingly, emitted light 390 passing through waveguide portion 350b in FIG. 3D has a smaller magnitude and a different internal reflecting pattern than the light passing through the waveguide portion 350b. Thus, the detector 330 can detect a change in the optical characteristics of emitted light 390 passing through the input portion 310.

Figure 4A:
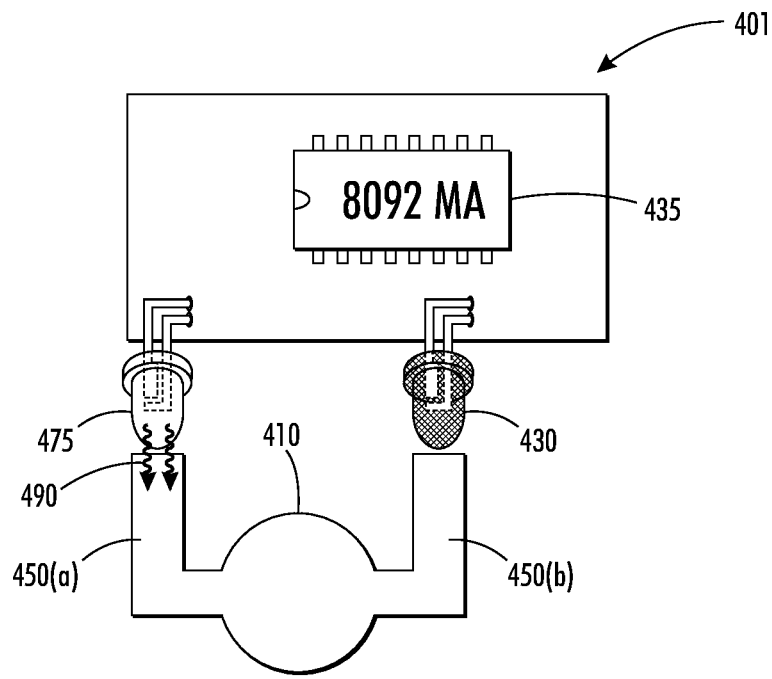
FIGS. 4A-B present an optical switch according to yet another aspect of the disclosure including coupling a light source and a detector to a controller.

FIG. 4A shows an exemplary embodiment of an optical switch 401 where a light source 475 and a detector 430 are coupled with a controller 435. As shown in FIG. 4A, the light source 475 transmits light via waveguide 450(a) to the input portion 410. Light passing through the input portion 410 is transmitted via the waveguide 450(b) to the detector 430.

Figure 4B:
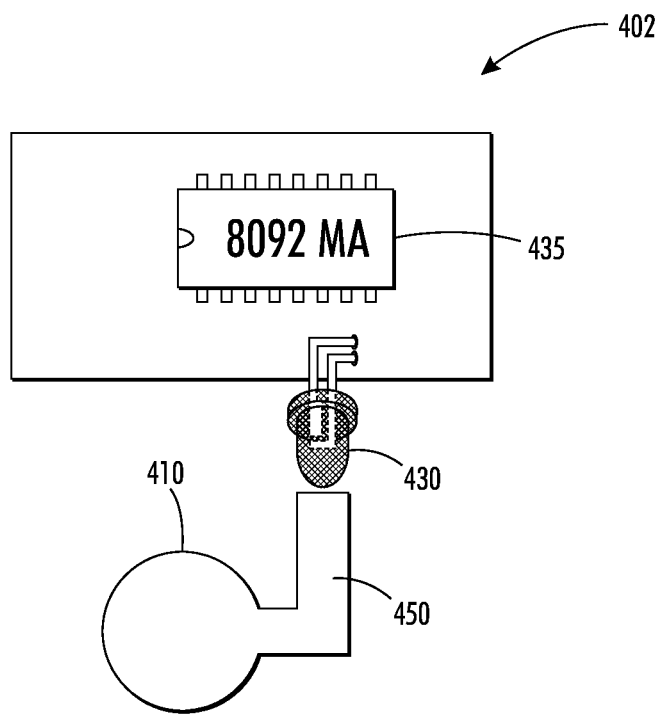

FIG. 4B shows an exemplary embodiment of an optical switch 402 where only a detector 430 is coupled with the controller 435. As shown in FIG. 4B, light passing through the input portion 410 is transmitted via the waveguide 450 to the detector 430.

The controller 435 may be any device that is capable of driving the light source 475 and/or monitoring the detector 430 to determine when a change in an optical characteristic occurs. The controller 435 can be formed on or off of the same substrate as the input portion 410, or alternatively on any other substrate. The controller 435 can be coupled to both the light source 475 and the detector 430, or just the detector 430. The detector 430 and the light source 475 can be coupled to the optical switch using any technique. For example, the detector 430 and the light source 475 can be optically coupled with the optical switch via pre-formed flexible receptacles that can attach to the optical switch and/or substrate. The receptacles direct light into and/or out of the optical switch.

Accordingly, the controller 435 can selectively apply the emitted light 490 from the light source 475 to the waveguide portion 450(a). Further, the controller 435 may detect a change in an output voltage received from the detector 430 in response to a sensed change in the emitted light 490 incident on the detector 430. The light source 475 and the detector 430 may be mounted to the same substrate as the controller 435, or alternatively, to any number of substrates.

Figures 5A, 5B:
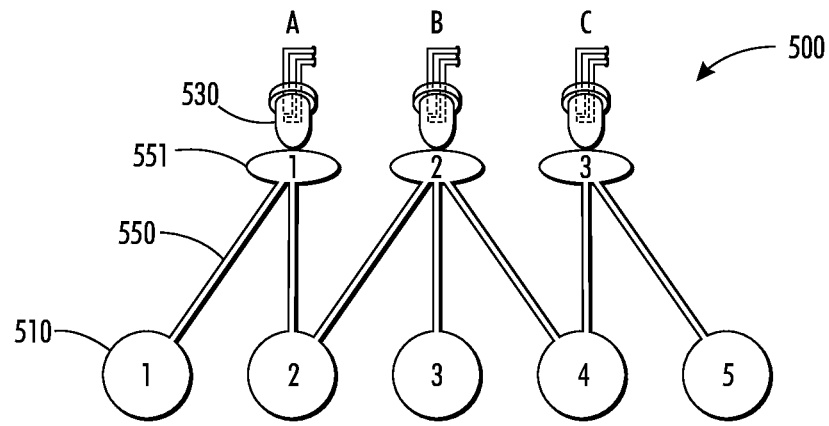
FIGS. 5A-B present a layout of a plurality of optical switches according to yet another aspect of the disclosure.

FIGS. 5A and 5B show an exemplary configuration of optical switches 500 where input portions 510 are arranged so that fewer detectors 530 are required for operation of the plurality of input portions 510. The configuration shown in FIG. 5A includes five input portions 510 that are coupled with waveguides 550 that selectively converge at respective converging portions 551. As shown, light from input portions 510(1) and 510(2) is directed into converging portion 551(1), while light from input portions 510(2), 510(3) and 510(4) is directed into converging portion 551(2), and light from input portions 510(4) and 510(5) is directed into converging portion 551(3). The detectors 530(A), 530(B) & 530(C) can be capable of detecting at least (1) the absence of incident light, (2) a low intensity input signal and (3) a high intensity input signal.

In operation, the detectors 530(A), 530(B) & 530(C) or an associated controller (not shown) can compare the respective light intensities at the converging portions 551 to determine which button has been depressed. FIG. 5B shows a truth table representing an exemplary control scheme for an exemplary embodiment of the optical switch 500 including a total of five input portions 510 and three detectors 530(A), 530(B) & 530(C). Some of the input portions 510 are coupled to more than one detector 530 such that changing an optical characteristic of a given input portion 510 can be detected with more than one detector 530. The input portions 510 may be configured such that each detector 530 coupled thereto can detect a different change, or a different degree of change, in the optical characteristic of light passing through the input portion 510.

The values of "HI" in the table of FIG. 5B represent a first type of detected change in an optical characteristic of light passing through an input portion 510, and the values of "LOW" represent a second type of detected change in an optical characteristic of light passing through an input portion 510. For example, a value of "HI" can represent a change in intensity for a high intensity signal received by one of the detectors 530, and a value of "LOW" can represent a change in intensity for a low intensity signal received by the detector 530. A high intensity signal can be accomplished by forming some input portions 510 such that an associated waveguide portion 550 is directly coupled to the detector 530. A low intensity signal can be accomplished by forming some input portions 510 such that an associated waveguide portion 550 is indirectly or partially coupled to the detector 530. By this control scheme, the three detectors 530(A), 530(B) & 530(C) in FIG. 5A may differentiate between obstructed/unobstructed states of any of the five input portions 510, as is depicted in the table of FIG. 5B. Accordingly, the layout depicted in FIGS. 5A & 5B may be considered to represent a multiplexing optical schematic. By this configuration, increased efficiency and lower cost may be achieved by requiring fewer detectors 530 to determine which input portion 510 is obstructed.

Figure 6:
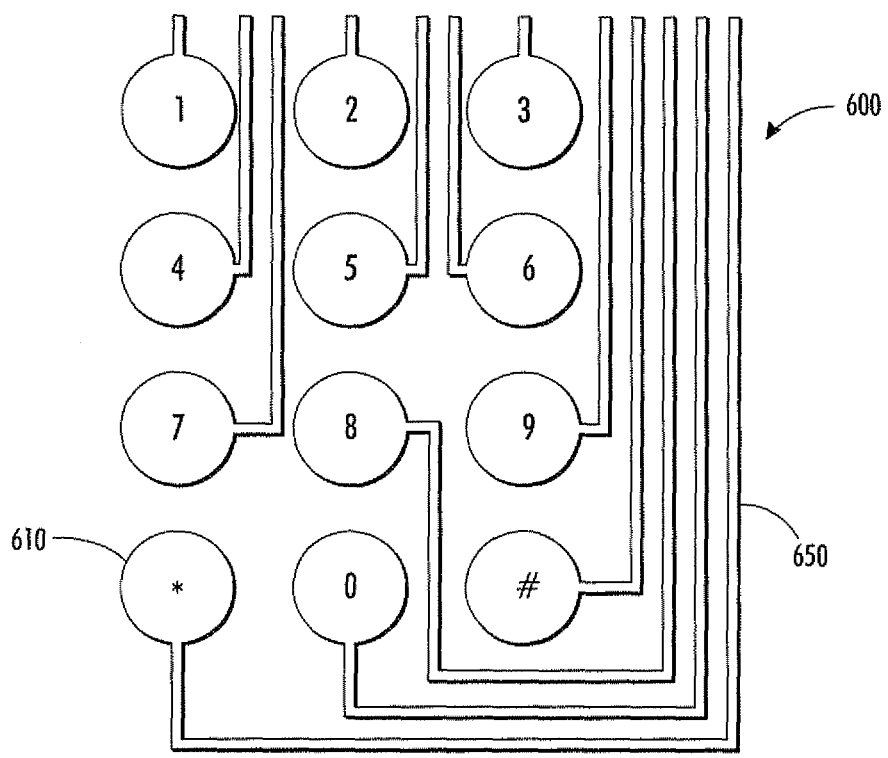
FIG. 6 presents another layout of a plurality of optical switches according to yet another aspect of the disclosure.

FIG. 6 shows another exemplary arrangement of optical switches 600. As shown in FIG. 6, the plurality of optical switches 600 has a plurality of input portions 610 and a plurality of waveguide portions 650. Although not shown in FIG. 6, a plurality of further waveguide portions may also couple a plurality of light sources to input portions 610. See FIGS. 3A & 4A, for example. As shown in FIG. 6, the input portions 610 may be arranged in a series of rows and columns, such as a matrix or keyboard configuration, with the waveguide portions 650 passing there between and around a side of the arrangement. While FIG. 6 depicts a keypad-like arrangement, this exemplary embodiment is not limited to this arrangement. The waveguide portions 650 may overlap so long as the detectors not shown) can differentiate a change in an obstructed/unobstructed state of one input portion from another input portion. For example, the waveguide portions 650 may overlap having a cladding layer formed at least between them to separate the waveguide portions 650.

Figure 7:
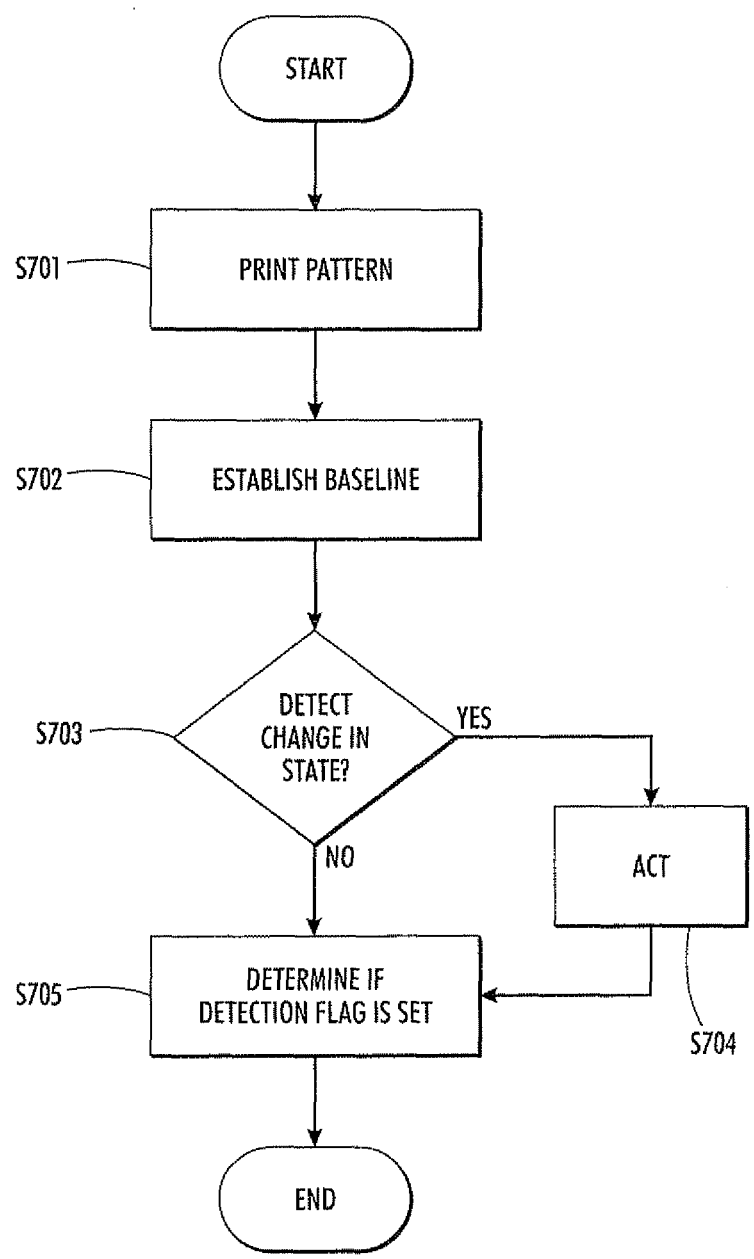
FIG. 7 presents a flowchart outlining an exemplary method of making and using an optical switch.

FIG. 7 shows a flowchart outlining an exemplary method of making and using an optical switch 100. The method begins with printing a pattern onto a substrate 120 in step S701. The printing in step S701 may be accomplished through any known prior art printing method including inkjet printing, offset press printing, xerographic printing, pad printing or painting. The printing in step S701 forms a pattern on the substrate 120, the pattern being formed by any known techniques, including screen-printing, electrostatic transfer, pressure transfer, and resist etching. Additionally, the material may be patterned after deposition, or, alternatively, selectively deposited. Printing in step S701 may also include a plurality of sub-steps, such as priming, mixing, printing and curing steps. At the conclusion of step S701, an optical switch 100 is formed on the substrate 120.

Next, in step S702, a baseline reading can be established. The baseline reading can be a reading by the detector 130 that establishes the current operating conditions for the optical switch 100 based on the amount of light traveling through the input portion 110 through waveguide 150 to the detector 130. Alternatively, an ambient detector 160 may establish a baseline reading. The ambient detector 160 may be coupled to the waveguide portion 150 to establish a baseline, or may sense the ambient conditions through another channel.

In step S703, the optical characteristic of light passing through the input portion is detected. For example, the detector 130 may periodically detect light transmitted through waveguide 150 from the input portion 110 and establish a current reading of the amount of light traveling through the input portion 110. Step S703 may take the baseline reading of step S702 into account to obtain a more accurate reading. For example, the controller 435 may compare the established baseline and current readings to make a determination of a difference between the two readings. If the difference between the current and baseline readings exceeds a predetermined threshold value, then the controller 435 can determine that the optical switch 100 has been activated and proceeds to step S704. If the difference does not exceed a predetermined threshold value, then the controller 435 determines that the optical switch 100 has not been activated and proceeds to step S705.

In step S704, the controller 435 determines that optical switch has been activated and, in turn, performs any corresponding function associated with the activation of the optical switch 100. The act associated with the activation of the optical switch 100 may be any act responsive to at least a binary input. For example, the act may be to register that a key of a keypad has been depressed, or that a power switch has been activated, and thus a device should be turned on. After accomplishing the requested act, the method continues to step S705.

In step S705, the controller 435 determines if a detection flag is set or not. The detection flag is a predefined condition wherein the method depicted in FIG. 7 is either ended or repeated. In each case, step S705 determines whether or not a flag is set or not. The detection flag can be stored in a memory of the controller. If the detection flag is set, then after the controller 435 determines whether or not the optical switch 100 has or has not been activated, the controller returns to establishing a baseline reading in step S702. On the other hand, if the detection flag is not set, then after controller determines whether or not the optical switch 100 has or has not been pressed, the controller ends the method of making and using.

As a modified example of any of the previously discussed embodiments, any of the optical switches 100-600 may include a cladding layer formed over the traces that form the waveguide portions. The cladding layer may fulfill the dual role of retaining light within the waveguide portion and preventing ambient light from entering the waveguide portion.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. An optical switch, comprising: a solid input portion printed on a substrate, the input portion being configured to change an optical characteristic of light passing through the input portion when the input portion is in contact with an external object; and a detector optically coupled with the input portion to detect a change in the optical characteristic of light passing through the input portion; further comprising a periphery portion on the substrate surrounding and coplanar with the input portion, the periphery portion touching at least part of the periphery of the input portion, the periphery portion comprising a material for optically containing light travelling within the input portion.

2. The optical switch of claim 1, further comprising:
a waveguide portion arranged on the substrate between the input portion and the detector and configured to guide light from the input portion to the detector.

3. The optical switch of claim 2, further comprising:
a cladding layer formed on a surface of the waveguide portion, the cladding layer being configured to retain light within the waveguide portion and prevent ambient light from entering the waveguide portion.

4. The optical switch of claim 1, further comprising:
a light source optically coupled with the input portion to provide light to the input portion.

5. The optical switch of claim 4, further comprising:
a first waveguide formed between the detector and the input portion; and
a second waveguide formed between the light source and the input portion.

6. The optical switch of claim 4, where during a first ode, light from the light source passes through the input portion with a first optical characteristic, and during a second mode light from the light source passes through the input portion with a second optical characteristic.

7. The optical switch of claim 6, wherein the detector detects whether the light passing through the input portion has the first optical characteristic or the second optical characteristic.

8. The optical switch of claim 6, wherein during the first mode, the input portion is unobstructed, while during the second mode, the input portion is in contact with the external object.

9. The optical switch of claim 6, wherein during the first mode, the input portion is unobstructed, while during the second mode, the input portion is covered by the external object.

10. A method of making the optical switch according to claim 1, comprising: printing an optical material onto a substrate to form an optical input portion thereon; and optically coupling a detector with the optical input portion, wherein the detector is configured to detect a change in an optical characteristic of light passing through the optical input portion.

11. The method of making an optical switch of claim 10, further comprising:
arranging a waveguide portion on the substrate between the input portion and the detector, wherein the waveguide portion is configured to guide light from the input portion to the detector.

12. The method of making an optical switch of claim 11, further comprising:
forming a cladding layer on a surface of the waveguide portion, the cladding layer being configured to retain light within the waveguide portion and prevent ambient light from entering the waveguide portion.

13. The method of making an optical switch of claim 11, further comprising:
providing a light source and optically coupling the light source with the input portion to provide light to the input portion.

14. The method of making an optical switch of claim 13, further comprising:
forming a first waveguide between the detector and the input portion; and
forming a second waveguide between the light source and the input portion.

15. The method of making an optical switch of claim 13, wherein the optical switch is configured with two modes of operation, wherein during a first mode, light from the light source passes through the input portion with a first optical characteristic, and during a second mode, light from the light source passes through the input portion with a second optical characteristic.

16. The method of making an optical switch of claim 15, wherein the detector detects whether the light passing through the input portion has the first optical characteristic or the second optical characteristic.

17. The method of making an optical switch of claim 13, wherein during the first mode, the input portion is unobstructed, while during the second mode, the input portion is in contact with an external object.

18. The method of making an optical switch of claim 14, wherein during the first mode, the input portion is unobstructed, while during the second mode, the input portion is covered by an external object.

19. A method of using the optical switch according to claim 1 that is printed on a substrate, comprising: monitoring light passing through an input portion; and detecting a change of optical characteristic of the light passing through the input portion, when the optical characteristic of the light changes from a first optical characteristic.

20. A user operated device including the optical switch of claim 1.

21. The optical switch of claim 1, wherein the input portion is a layer of transparent material.

22. The optical switch of claim 1, wherein the input portion comprises a layer of clear toner.

23. The optical switch of claim 1, wherein the input portion comprises a layer of transparent material, the material being chosen from the group consisting of gloss varnish, epoxy resin, silicone gel, UV hardened clear material and clear dried ink.

24. The optical switch of claim 1, wherein the periphery portion comprises opaque toner.

25. The optical switch of claim 1, wherein the periphery portion comprises opaque ink.

26. The optical switch of claim 1, wherein the material comprises a metallic colorant.

27. The optical switch of claim 1, further comprising an ambient light detector coupled to the detector.

* * * * *